United States Patent
Smith et al.

(10) Patent No.: US 7,376,022 B2
(45) Date of Patent: May 20, 2008

(54) METHOD USING A ONE-TIME PROGRAMMABLE MEMORY CELL

(75) Inventors: Douglas D. Smith, Mesa, AZ (US); Myron Buer, Gilbert, AZ (US); Bassem F. Radieddine, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 15 days.

(21) Appl. No.: 11/589,115

(22) Filed: Oct. 30, 2006

(65) Prior Publication Data

US 2007/0041246 A1 Feb. 22, 2007

Related U.S. Application Data

(63) Continuation of application No. 10/929,609, filed on Aug. 31, 2004, now Pat. No. 7,136,303.

(51) Int. Cl.
*G11C 11/34* (2006.01)

(52) U.S. Cl. ............... 365/189.05; 365/225.7; 365/148

(58) Field of Classification Search ........... 365/189.05, 365/225.7, 148
See application file for complete search history.

(56) References Cited

U.S. PATENT DOCUMENTS

| | | | |
|---|---|---|---|
| 4,394,748 A * | 7/1983 | Campbell, Jr. | 365/189.09 |
| 4,507,756 A * | 3/1985 | McElroy | 365/104 |
| 5,576,985 A * | 11/1996 | Holtz | 365/49 |
| 5,798,961 A | 8/1998 | Heyden et al. | |
| 6,026,029 A * | 2/2000 | Dosaka et al. | 365/189.01 |
| 6,243,283 B1 | 6/2001 | Bertin et al. | |
| 6,525,955 B1 | 2/2003 | Smith et al. | |
| 6,580,657 B2 | 6/2003 | Sanford et al. | |
| 6,693,819 B2 | 2/2004 | Smith et al. | |
| 6,700,176 B2 | 3/2004 | Ito et al. | |
| 6,704,236 B2 | 3/2004 | Buer et al. | |
| 6,707,696 B1 | 3/2004 | Turner et al. | |
| 6,744,660 B2 | 6/2004 | Smith et al. | |
| 6,956,779 B2 | 10/2005 | Tran | |
| 2004/0157379 A1 | 8/2004 | Ito et al. | |
| 2006/0044861 A1 | 3/2006 | Smith et al. | |

OTHER PUBLICATIONS

"Broadcom Announces BroadSAFE Security, Enabling More Secure Networks Through Strong Identity and Key Management Capabilities: Integrated Hardware-Based Identity Management and Authentication to Be Embedded Within Multiple Broadcom Network Infrastructure Silicon Products", 5 pages, May 11, 2004, printed from http://www.broadcom.com/press/release.php?id=525430&printable=1.

* cited by examiner

Primary Examiner—Tuan T. Nguyen
(74) Attorney, Agent, or Firm—Sterne, Kessler, Goldstein & Fox, P.L.L.C.

(57) ABSTRACT

A one-time programmable device includes a controller, a protection system, a static storage element and a latch, which can be referred to as a latch-based one-time programmable (OTP) element. In one example, the static storage element includes a thin gate-oxide that acts as a resistance element, which, depending on whether its blown, sets the latch into one of two states.

8 Claims, 3 Drawing Sheets

US 7,376,022 B2

METHOD USING A ONE-TIME PROGRAMMABLE MEMORY CELL

CROSS REFERENCE TO RELATED APPLICATIONS

This application is a continuation of U.S. application Ser. No. 10/929,609, filed Aug. 31, 2004, now U.S. Pat. No. 7,136,303 which is incorporated by reference herein in its entirety.

BACKGROUND OF THE INVENTION

1. Field of the Invention

The present invention is related to systems and methods utilizing one time programmable memory cells.

2. Background Art

Typically, chips contain circuits that include one or more one time programmable (OTP) memory elements. OTP memory elements are used to store a single digit, e.g., a 1 or a 0, for many purposes. The 1 or the 0 is typically based on a state of the OTP memory elements, e.g., whether it is in an open state or a short state, where which state corresponds to a logic 0 or a logic 1 is application specific.

Conventionally, to program the OTP memory element a current larger than is necessary during normal operation of the chip is required, which results a device to be larger than would be desired. Thus, a typical OTP memory element has a relatively large surface area to withstand the high current. Also, some OTP memory elements must be programmed before packaging of the chip, which typically occurs before final testing of the chip. Thus, because the OTP memory element is programmed without knowing if the chip requires adjustments, its effectiveness can be reduced.

Therefore, what is needed is system and method that allows for a OTP memory element in a circuit on a chip, where the OTP memory element: can be programmed using a low current, takes up less surface area of the chip, and/or can be programmed before or after packaging of the chip.

BRIEF SUMMARY OF THE INVENTION

An embodiment of the present invention provides a system comprising a controller, a dynamic storage device coupled to the controller, a static storage element coupled to the controller and the dynamic storage device, and a protection system coupled to the controller, the dynamic storage device, and the static storage element. A change of state of the static storage element is accomplished using a high voltage, low current signal from the controller. The state of the static storage element is determined by the dynamic storage element based on a resistance of the static storage element.

Another embodiment of the present invention provides a method comprising the steps of (a) setting a state of a static storage element using a high voltage, low current signal, (b) sensing the state of a static storage element using a dynamic storage device, and (c) operating a system based on step (b).

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
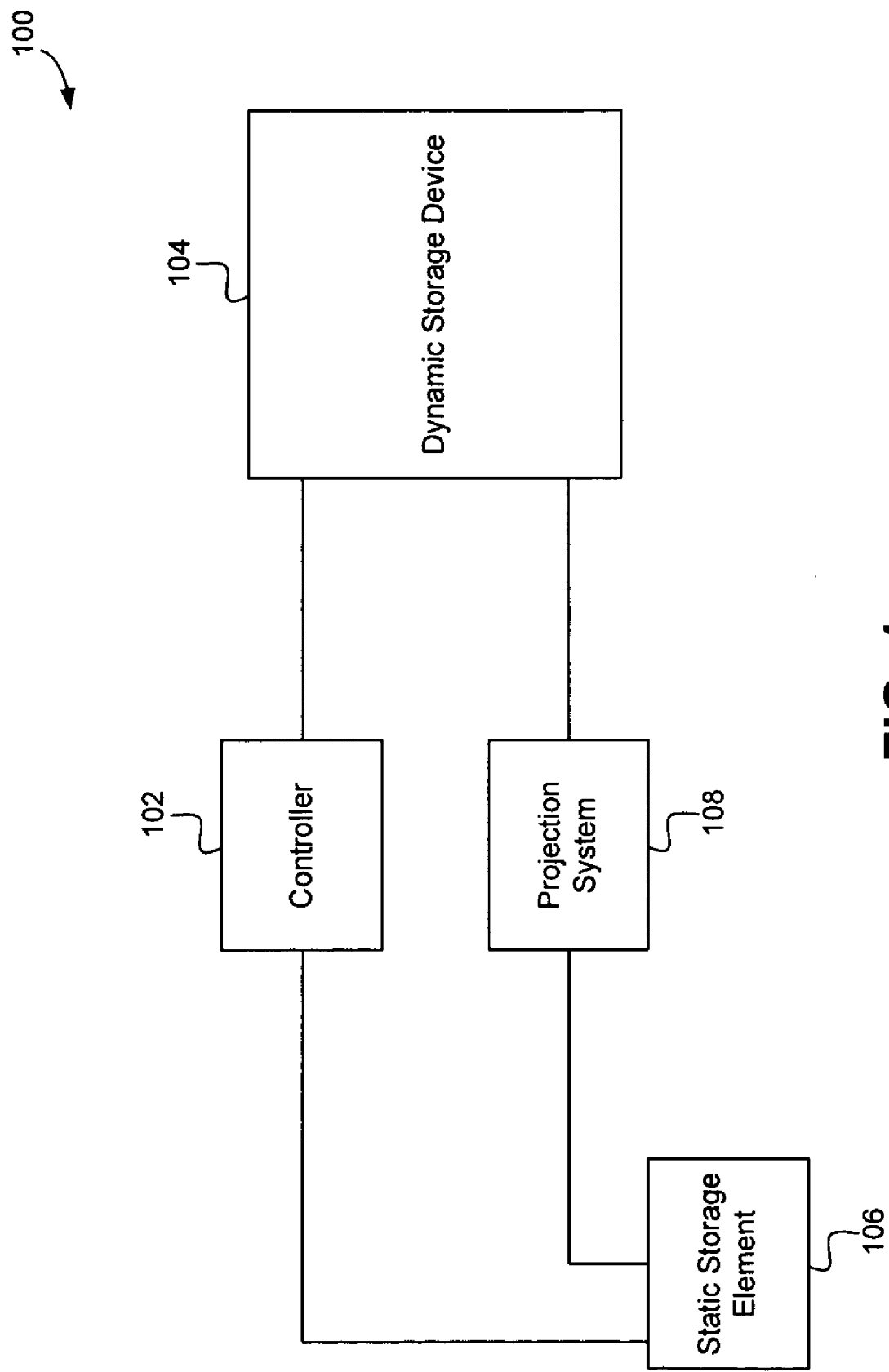
FIGS. 1 and 2 are block diagram representation of systems including a static memory element, according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a one-time programmable (OTP) device. In one example, the one time programmable device includes a controller, a protection system, a static storage element and a latch, which can be referred to as a latch-based OTP element. In one example, the static storage element comprises a thin gate-oxide that acts as a resistance element, which, depending on whether its blown, sets the latch into one state or another.

Prior to setting the latch-based OTP element, the thin gate oxide has a high resistance (e.g., in about the Giga (G) ohm range), which is reduced substantially to a low resistance (e.g., in about the low kilo (K) ohm range) after being blown. In one example, this setting is accomplished through exposing of a gate of the static storage element to a high voltage (e.g., about 5.0V) and substantially lower current than conventional devices. The blowing mechanism is irreversible.

At power-up of a chip containing the latched-based OTP device, based on the resistance value of the thin gate-oxide, the latch, and hence the memory cell, will assume one state or another.

Since only a small switching current is going to flow through the thin gate-oxide resistance at power-up to set the state of the latch, the lifetime of the latch-based OTP is prolonged as compared with other OTP devices, such as a poly fuse, described below, that requires a continuous sensing current to operate, which makes the latch-based OTP device more reliable.

Also, because the latch-based OTP element requires a low current to blow, it does not need large transistors to handle the current. For example, the latched-based OTP element may require as little as 1 miliampere (ma) to change state, while other OTP devices, such as a polycrystalline silicon (poly) fuse described below, require as much as 20 ma to chaine state. Thus, an area taken up on the chip by the latch-based OTP is very small as compared with a other OTP devices, such as a poly fuse described below, because typically an area of a device is based on an amount of current it needs to handle. This reduction in surface area for the latched-based OTP allows for an increase in a number of devices that can be fabricated on a single chip.

Further, a ratio of pre-blown to post-blown resistance is substantially larger with the latched-based OTP element compared to other OTP devices, such as a poly fuse described below. For example, a latched-based OTP element can have a high resistance that is five orders of magnitude larger than a low resistance (e.g., 10 ohms to 100 G Ohms in a low-leakage gate), while a poly fuse typically only has a four orders of magnitude difference. Thus, there is a large variation in resistance value. This allows for relatively simple testing or verification to determine whether the latched-based OTP element is blown (programmed) or not blown (not programmed).

Still further, the latch-based OTP has a set mode (e.g., a test mode) that can set the state of the memory cell regardless of what the resistance value of the thin gate-oxide is, which is very useful for debugging purposes. Previous OTP devices, such as the poly fuse described below, do not support this feature.

Exemplary One Time Programmable Memory Devices

One time programmable (OTP) memory is used as a memory element or a reconfiguring element in a circuit on a chip. Typically, OTP memory comprises fuse elements, such as laser fuses or poly fuses.

A laser fuse is a semiconductor device that has a notch area that is blown using an external laser beam. When blown, a laser fuse goes from a short in a circuit to an open in the circuit. Programming is typically done at a single location, at which the chip or a wafer holding the chip is positioned in front of the laser. The chip or wafer include alignment marks to align them before blowing the fuse. Typically, a latch is associated with the laser fuse to determine what state it is in. The laser fuse has to be blown before packaging of the chip.

A poly fuse is a semiconductor device that receives a high current to blow a layer of the poly material. The poly fuse element has a low pre-blown resistance (e.g., about 10-20 ohms) that turns into a high resistance (e.g., about 300-800 ohms) after it is blown with the large current. The poly fuse element consumes a large area because it requires the large current to blow, and continuously suffers from lower and lower post-to-pre-blown resistance ratio as the silicon process technology scales down. In addition, there is a reliability concern over the use of poly fuses because a continuously flowing sensing current is required.

In comparison, the poly fuse starts with a low resistance and then changes to a high resistance after been blown, while the latch-based OTP, described in detail below, starts with a high resistance and then changes to a low resistance after being blown.

Exemplary Latched Based OTP Memory Cell

Figure 2:
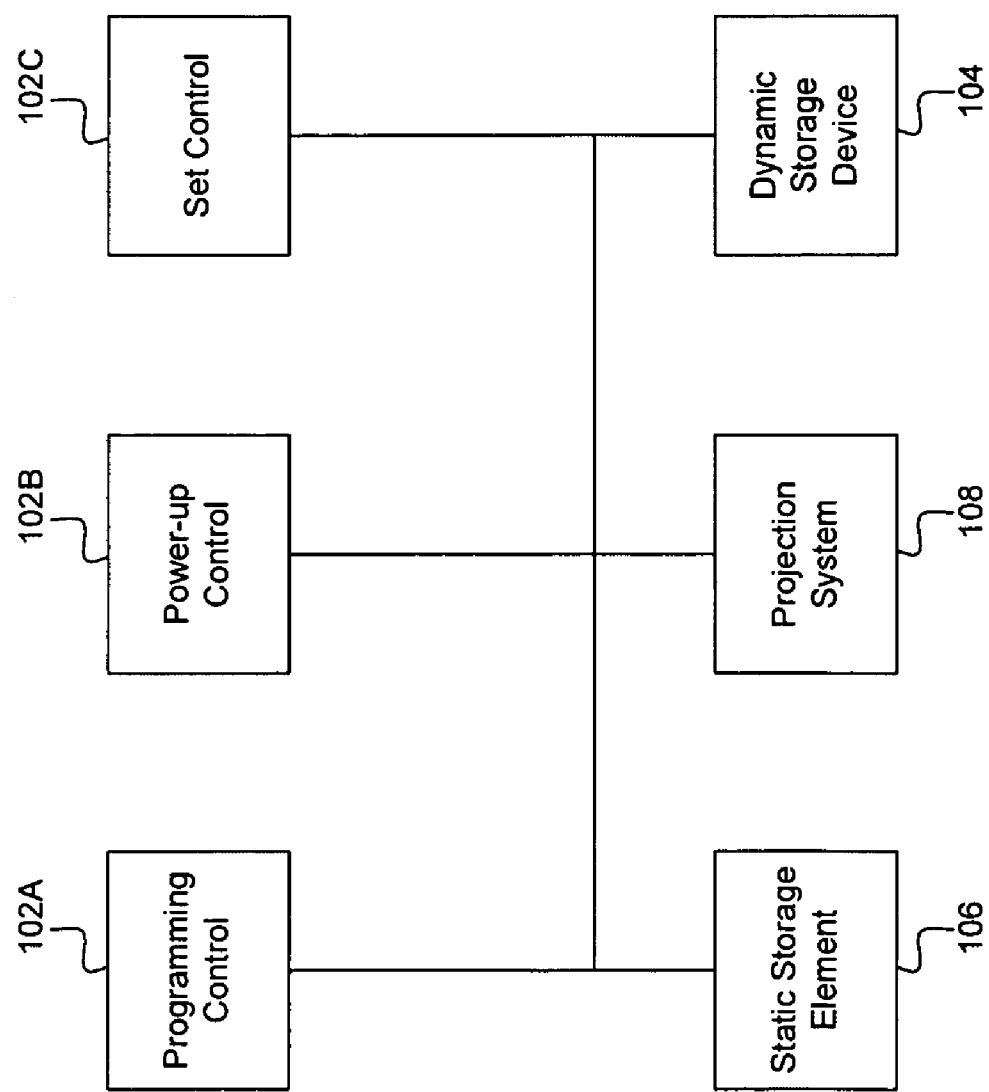

FIGS. 1 and 2 show a system 100, according to various embodiments of the present invention. System 100 includes a controller 102, a dynamic storage device 104, a static storage element 106, and a protection system 108. As discussed in more detail below, controller can control a mode of operation of system 100. For example, the different modes of system 100 are, but are not limited to, programming mode, power-up mode, set mode (e.g., testing mode), and the like.

In one example, these exemplary modes can be controlled, as shown in FIG. 2, using programming control 102A, power-up control 102B, and set control 102C. These controllers 102A-102C can be part of a single controller 102 or separate elements, as would be apparent to one of ordinary skill in the art. It is to be appreciated that if other modes are used in system 100, other controllers can be coupled to system 100, as would be apparent to one of ordinary skill in the art, or controller 102 can operate to perform these additional and/or alternative modes.

In one example, dynamic storage device 104 is used to store information that determines what state static storage element 106 is in. For example, dynamic storage element 104 is, but is not limited to, a latch, a register, a logic device or function that stores a state, a resettable latch, or the like. In operation, dynamic storage element 104 determines whether static storage element 106 is in a 1 or 0 state (HIGH or LOW state).

In one example, the state is based on whether static storage element 106 is blown (programmed) or not blown (not programmed), which is determined by dynamic storage element 104 sensing an impedance of static storage element 106. The concept of "blown" is described above and below. Because its application specific, in one example, 1 or HIGH signifies static storage 106 element is blown, while in another example 0 or LOW signifies static storage element 106 is blown. What signifies blown is application specific and preprogrammed in dynamic storage device 104 for each different application.

In one example, static storage element 106 is used to store a digit for a security code or a security bit. It is to be appreciated that it would be apparent to one of ordinary skill in the art to use a plurality of static storage elements 106 and/or a plurality of systems 100 in order to increase a complexity of the security code. Thus, using a plurality of one or both of these elements would allow for a multi-bit security code to be stored.

In other examples, static storage element 106 is used to store a configuration bit, an identification bit, a unique register bit, or the like, and similar to as described above, a plurality of static storage elements 106 or systems 100 can be used to increase a number of bits that can be permanently stored.

The bit or code might: (1) be used by a manufacturer to track the chip, a device on the chip, a version of the chip, etc.; (2) be used by a manufacturer or user of the chip to determine what application each device on the chip has been associated with; (3) be used for configuration redundancy for memories (e.g., redundancy repair) that need to replace a single bit or a plurality of bits because of malfunction, wear, or defects; (4) be used for analog tweaking of a device, for example, to trim a component of an analog device, such as a resistor, a capacitor, an amplifier, a filter, an inductor, or the like, before or after packaging of the analog device, sometimes based on testing of the analog device before an initial use or intermittently during its operation.

It is to be appreciated that this is an illustrative and not exhaustive list of uses for the bit or code, while others will become apparent to one of ordinary skill in the art upon reading and understanding this description.

In one example, protection system 108 is utilized during programming mode when a high voltage is used to program static storage element 106. Through use of protection system 108 during programming mode, the high programming voltage does not pass to dynamic storage device 104, which prevents possible damage of dynamic storage device 104. When system 100 is not in programming mode, protecting system 108 is essentially OFF and allows voltage to pass to dynamic storage device 104. For example, protection system 108 is, but is not limited to, any type of transistor or circuit that can protect the flow of high voltage into dynamic storage device 104. When a transistor is used, the transistor is ON during normal operation and OFF during programming.

In one example, packaging is formed over the controller, the dynamic storage device, the static storage element, and the protection system. For example, the packaging can be used to protect the devices from environmental conditions or can be used to make the devices more secure. In this example, the state of static storage element 106 is capable of being set before or after the packaging is formed.

Exemplary Circuit Implementing the System

Figure 3:
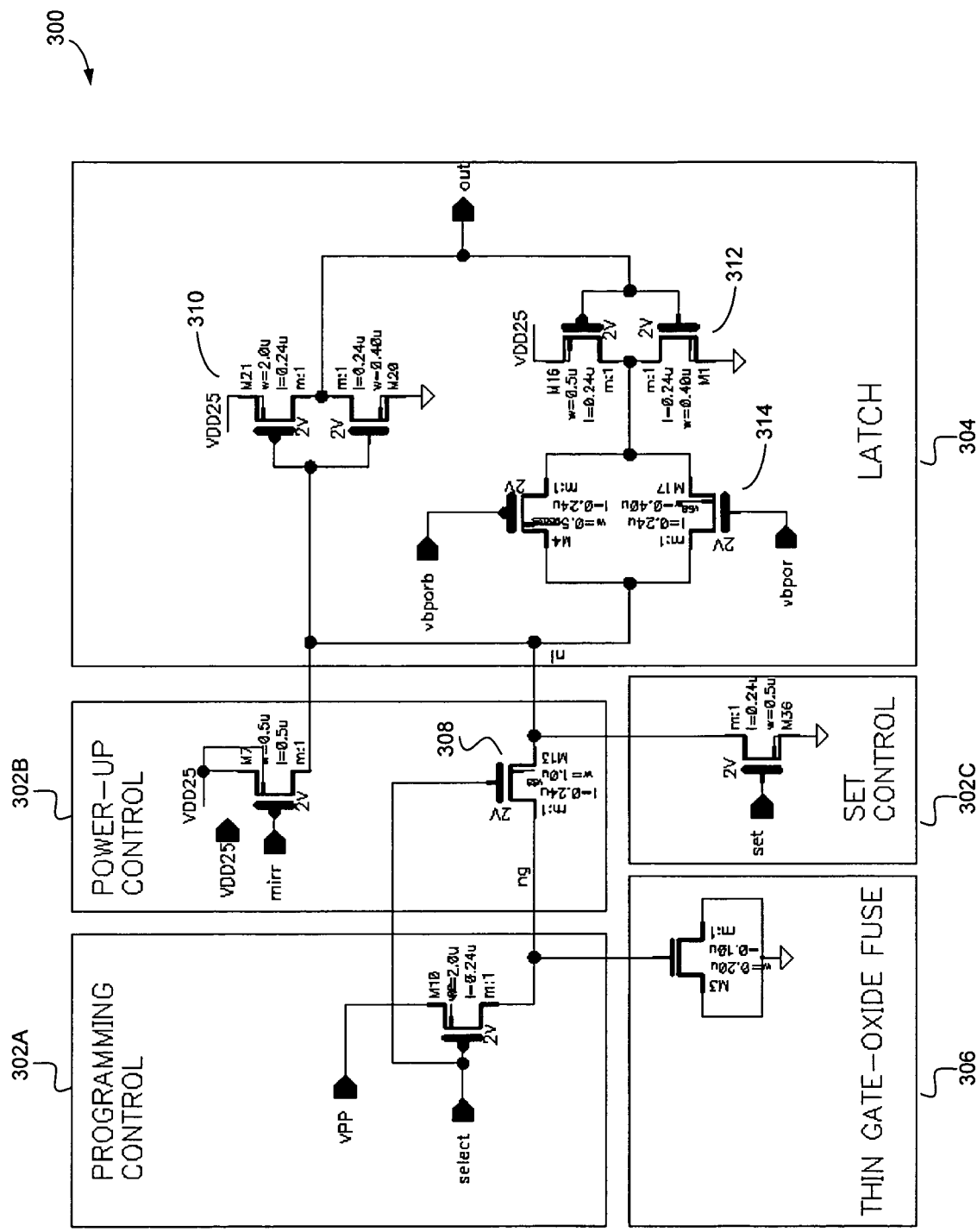
FIG. 3 is an exemplary schematic diagram of a circuit including a static memory element, according to one embodiment of the present invention.

FIG. 3 is an exemplary schematic diagram of a circuit 300 including a static memory element 306, according to one embodiment of the present invention. All parameters shown in FIG. 3 are directed to one exemplary application of system 100. It is to be appreciated that when used for other applications, circuit 300 can include devices exhibiting other characteristics.

In one example, circuit 300 includes programming control 302A, power-up control 302B, set control 302C, latch 304, a thin gate-oxide fuse 306, and a protection device 308.

Latch section 304 is coupled to power-up control 302B and set control 302C, and protection device 308 via a node n1. Latch section 304 comprises a first inverter 310, a second inverter 312, and a passgate or feedback transmission gate 314. Latch 304 is responsible for holding (storing) a logic state of thin gate-oxide fuse 306 acting as a memory element.

In one example, inverters 310 and 312 and passgate 314 comprise CMOS transistor devices.

First inverter 310 comprises a thick gate-oxide NMOS transistor (M20) and a thick gate-oxide PMOS transistor (M21). NMOS transistor M20 is coupled to node n1 at its gate, to a node Out at its drain, and to ground at its source. PMOS transistor M21 is coupled to node n1 at its gate, a voltage VDD25 at its drain, and to node Out at its source.

In one example, node OUT transmits an out signal, which is the output of thin gate-oxide fuse 306. When thin gate-oxide fuse 306 NMOS M3 is blown, it will have a small resistance to ground and hence node n1 is LOW and the out signal is HIGH (e.g., 2.5V). When thin gate-oxide fuse 306 NMOS M3 is not blown, it will have a large resistance to ground and hence node n1 is HIGH and the out signal is LOW (e.g., 0 V).

Second inverter 312 (e.g., a feedback inverter) comprises a thick gate-oxide NMOS transistor (M1) and a thick gate-oxide PMOS transistor (M16). NMOS transistor M1 is coupled to node Out at its gate, to ground at its source, and to sources of a PMOS transistor M4 and an NMOS transistor M17, which form feedback transmission or passgate 314, at its drain. PMOS transistor M16 is coupled to node Out at its gate, sources of PMOS transistor M4 and NMOS transistor M17 at its source, and VDD25 at its drain.

Feedback transmission gate or passgate 314 comprises a thick gate-oxide NMOS transistor (M17) and a thick gate-oxide PMOS transistor (M4). NMOS transistor M17 is coupled to vbpor at its gate and node n1 at its drain. PMOS transistor M4 is coupled to vbporb at its gate and n1 at its drain.

In one example, vbporb is the inverted signal of vbpor. These signals are used to open or close latch 304. When vbpor is HIGH (e.g., about 2.5V), latch 304 is closed. When vbpor is LOW (e.g., about 0V), latch 304 is open. vbpor is LOW (e.g., about 0V) at power-up or during the verify mode, and it's HIGH (e.g., about 2.5V) otherwise.

These signals are generated based on different operation modes.

In one example, during the power-up mode, a power on reset signal (por) is generated. This por signal is initially LOW (e.g., about 0V) and then switches to HIGH (e.g., about 2.5V) after power-up. When this por signal is LOW (e.g., about 0V), vbpor signal is LOW (0V) and vbporb signal is HIGH (e.g., about 2.5V). When the por signal is HIGH (e.g., about 2.5V), vbpor signal is HIGH (e.g., about 2.5V) and vbporb signal is LOW (e.g., about 0V).

In one example, during the verify mode, a verify signal is generated.

When in verify mode, verify is HIGH (e.g., about 2.5V) and it's LOW (e.g., about 0V) otherwise. When this verify signal is LOW (e.g., about 0V), vbpor signal is HIGH e.g., about (2.5V) and vbporb signal is LOW (e.g., about 2.5V). When the verify signal is HIGH (e.g., about 2.5V), vbpor signal is LOW (e.g., about 0V) and vbporb signal is HIGH (e.g., about 2.5V). In summary:

| por | verify | vbpor | vbporb |
|------|--------|-------|--------|
| LOW | X | LOW | HIGH |
| HIGH | HIGH | LOW | HIGH |
| HIGH | LOW | HIGH | LOW |

Thin gate-oxide fuse 306 is a small, thin gate-oxide NMOS transistor (M3) whose source and drain are connected to ground and whose gate is connected to both programming control section 302A and power-up control section 302B via a node ng. In one example, fuse 306 is a high density electric fuse. It is to be appreciated that other devices and/or circuits could also be used that function as described herein, as would be apparent to one of ordinary skill in the art.

Programming control section 302A comprises a thick gate-oxide PMOS transistor (M10) and is responsible to select a certain memory cell (e.g., in embodiments when programming control section 302A is coupled to multiple memory cells 306, each storing a single bit of information) to be programmed. This allows a high voltage supply (VPP) to be connected to thin gate-oxide fuse 306. PMOS transistor M10 is coupled to VPP at its drain, to a select pin and to a gate of protection device 308 (e.g. an NMOS transistor (M13)) at its gate, and to node ng at its source.

In one example, the select signal is used to select thin gate-oxide fuse 306 (e.g., a single memory cell) to be programmed during the programming mode. During the programming mode, the select signal is LOW (e.g., about 0V) for a selected thin gate-oxide fuse 306 and is at VPP (e.g., about 5V) for a non-selected thin gate-oxide fuse 306. During a non-programming mode the select signal is at 2.5V for all thin gate-oxide fuses 306.

Power-up control section 302 B comprises a thick gate-oxide PMOS transistor (M7) and protection device 308 (e.g., thick gate-oxide NMOS transistor (M13)), and is responsible for setting the state of latch 304 together with the help of thin gate-oxide fuse 306. PMOS transistor M7 is coupled to latch 304 via node n1 at its source, to pin mirr at its gate, and to VDD25 at its drain. NMOS M13 is coupled between programming control 302A, thin gate-oxide fuse 306, set control 302C, and latch 304. NMOS M13 is coupled to node ng at its drain, select pin at its gate, and node n1 at its source.

In one example, The mirr signal is used to help determine the state (1 or 0) of thin gate-oxide fuse 306 during the power-up mode or the verify mode. The mirr signal is an analog signal (e.g., about 0 to about 2.5V) during power-up mode or the verify mode, and is at 2.5V for any other mode. The mirr signal will control the amount of current that the PMOS transistor M7 can deliver based on the analog voltage level of the mirr signal. The lower the analog voltage level of the mirr signal, the more the current that the PMOS transistor M7 can deliver. This current is going to counter the fuse resistance (NMOS M3). If the fuse is blown, it's going to have a small resistance and hence the current through M7 is not going to able to withstand this, and so node n1 is going to be at a LOW state (0). Similarly, if the fuse is not blown, it's going to have a large resistance and hence the current through M7 is going to able to fight and so node n1 is going to be at a HIGH state (1). During the verify mode, the mirr signal is going to be at a lower analog voltage level so that the PMOS M7 can deliver more current, thus; trying to screen lower blown fuse resistance.

Set control section 302 C comprises a thick gate-oxide NMOS transistor (M36) and is responsible to override a resistance of thin gate-oxide fuse 306 and set the state of latch 304 into one given state. Set control section 302C is coupled to power up control 302B, protection device 308, and latch 304 via node n1. NMOS transistor M36 is coupled to a set pin at its gate, ground at its source, and node n1 at its drain.

In one example, the set signal is used to set the state of thin gate-oxide fuse 306 to a HIGH state (logic 1) by bringing node n1 to ground. When the set signal is HIGH (e.g., about 2.5V), it will set the state of thin gate-oxide fuse 306 to HIGH (logic 1), and when the set signal is LOW (e.g., 0V) it will not do anything.

Exemplary Operation of the Circuit

In one example, circuit 300, which can be considered a latch-based OTP memory cell, has four modes of operation: programming mode using programming control 302A, power-up mode using power-up control 302B, verify mode using power-up control 302B, and set/verify mode using set control 302C.

During programming mode, the programming is performed by applying a high voltage supply (e.g., VPP, for example about 5.0V) through transistor (M10) and into the gate of thin gate-oxide NMOS transistor (M3) 306 in a selected memory cell, e.g., when multiple memory cells 306 are available to store a bit. The programming is done on a single memory cell 306 at any given time. The control signal received at the select pin for a selected memory cell 306, at VPP for a non-selected memory cell 306, and at VDD25=2.5V in a non-programming mode. Also, during programming mode, transistor M7 is turned OFF when transistor M13 is turned OFF for the selected memory cell (i.e., by having select at ground) and transistor M7 is turned ON for all the other non-selected memory cells (i.e., by having select at VPP). During a non-programming mode, transistor M13 is always turned ON in order to connect thin gate-oxide fuse 306 to latch 304. The voltage supply VPP is at around 5.0V during programming and is at around 2.5V during any non-programming mode.

Thus, in this example, protection device 308 (M13) prevents a high voltage from passing to node n1 during programming mode, and possibly set/verify modes, so that only pin VPP and node n1 see the high voltage. During normal operation, transistor M13 passes voltage to latch 304.

During power up mode: a) the latch feedback formed by NMOS transistor M17 and PMOS transistor M4 is disconnected by having (vbpor) signal at ground and (vbporb) signal at VDD25; b) PMOS transistor M7 is slightly turned ON by having the control signal at mirr below VDD25, so the control signal tries to raise the voltage of node n1 above a trip point of inverter 310, which comprises transistors M20 and M21; c) the VPP supply and the select signal are both at VDD25; d) NMOS transistor M13 308 is fully ON in order to connect thin gate-oxide fuse 306 to node n1; and e) PMOS transistor M10 is turned OFF in order to disconnect thin gate-oxide fuse 306 from the VPP supply.

In this example, power up control 302B performs at least two functions. First, during power up it provides a leakage path to set the voltage for node n1. Second, its sets a current level of a different value for the verify mode. Thus, when thin gate-oxide fuse 306 has been programmed, power up control 302B allows the verify mode to ensure desired margins are present.

Thus, depending on the impedance (e.g., resistance) value of thin gate-oxide fuse 306, the voltage at node n1 will be above or below the trip point of inverter 310 formed by transistors M20 and M21. This sets the state of latch 304 into one of two states (e.g., latched or not latched). After the power-up is done and a normal mode starts, transistor M7 will be turned OFF completely by having signal mirr at VDD25. Latch feedback gate or passgate 312 is connected back, which closes latch 304 and holds the state.

During verify mode, circuit 300 will behave the same as at power-up mode with the only difference: M7 will be turned ON harder by lowering the voltage on signal mirr below it's value power-up mode. This ensures that the resistance value of a blown thin gate-oxide fuse 306 is less than what it needs to be at power-up mode by a certain margin. In one example, this margin allows circuit 300 to function as desired over substantially all temperature and voltage conditions. This ensures thin gate-oxide fuse 306 was programmed within margin, so that over time, and over different conditions (e.g., temperature and voltage variations), thin gate-oxide fuse 306 is still operating as desired. In one example, this also ensures thin gate-oxide fuse 306 will operate under extreme conditions. However, if gate-oxide fuse 306 is not blown yet, this verifying procedure will not cause it to blow.

Set mode (e.g., test mode) is used to override the impedance value of thin gate-oxide fuse 306 by turning ON the thick gate-oxide NMOS transistor M36 and thus setting the state of latch 304 into a given, known state. This mode is useful for testing and debugging. Thus, in set mode, the impedance value of thin gate-oxide fuse 306 can be overridden.

When thin gate-oxide fuse 306 is not programmed or not blown, during power up it draws no current, its gate is HIGH driving its output to a LOW state. This LOW state is sensed at inverter 310 and the LOW state is latched by inverter 312. In this state, passgate 314 is open and allows a signal to flow, which will cause latch 304 to hold the zero or LOW state. Thus, when passgate 314 is active or on, it is latched.

When thin gate-oxide fuse 306 is programmed or blown, during power up node ng is LOW because gate-oxide fuse 306 is a low impedance to ground. This gives a HIGH at the output. Also, latch 304 will be closed to hold a HIGH signal. Passgate 314 is shut off, so it does not pass a signal, and latch 304 passes a signal from node ng to inverter 310. Thus, when passgate 314 is not active or off, transistors M1 and M17 are OFF and passing a signal from node n1.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
   (a) setting a state of a static storage element using a high voltage, low current signal;
   (b) sensing the state of a static storage element using a dynamic storage device; and
   (c) operating a system based on step (b).

2. The method of claim 1, further comprising:
   (d) using a controller to set a mode of operation of the system.

3. The method of claim 2, wherein the mode of operation of the system is one of programming mode, power up mode, and verify mode.

4. The method of claim 3, wherein the programming mode is used to perform step (a).

5. The method of claim 3, further comprising:
   (e) protecting the dynamic storage device during at least one of the programming mode and the verify mode.

6. The method of claim 1, wherein step (b) comprises using a latch, a register, or a logic function that stores a state as the dynamic storage device.

7. The method of claim 1, wherein step (a) comprises using a one time programmable memory, a single bit storage device, or a thin gate oxide fuse as the static storage element.

8. The method of claim 1, wherein step (a) comprises:
   representing a security bit, a configuration bit, an identification bit, or an adjustment bit through the state of the static storage element.

* * * * *